United States Patent [19]

Pricer

[11] 4,445,201
[45] Apr. 24, 1984

[54] SIMPLE AMPLIFYING SYSTEM FOR A DENSE MEMORY ARRAY

[75] Inventor: Wilbur D. Pricer, Burlington, Vt.

[73] Assignee: International Business Machines Corporation, Armonk, N.Y.

[21] Appl. No.: 325,697

[22] Filed: Nov. 30, 1981

[51] Int. Cl.³ .............................................. G11C 11/40
[52] U.S. Cl. .................... 365/154; 307/530; 307/DIG. 3
[58] Field of Search ................... 307/530, 355, 238.6, 307/200 B, 279; 365/154, 156, 190, 202, 203, 205, 208, 210

[56] References Cited

U.S. PATENT DOCUMENTS

| | | | |
|---|---|---|---|
| 3,387,286 | 6/1968 | Dennard | 340/173 |
| 3,588,844 | 6/1971 | Christensen | 340/173 |
| 3,811,076 | 5/1974 | Smith, Jr. | 317/235 R |
| 3,841,926 | 10/1974 | Garnache et al. | 148/188 |
| 3,940,747 | 2/1976 | Kuo et al. | 340/173 DR |
| 4,040,017 | 8/1977 | Lee | 340/173 R |
| 4,069,475 | 1/1978 | Boettcher | 365/205 |
| 4,080,590 | 3/1978 | Pricer | 365/149 |
| 4,160,275 | 7/1979 | Lee et al. | 365/149 |
| 4,287,576 | 9/1981 | Pricer | 365/203 |

OTHER PUBLICATIONS

W. K. Hoffman, IBM Technical Disclosure Bulletin, vol. 16, No. 7, Dec. 1973, p. 241, "Interleaved Memory Array".

*Primary Examiner*—Joseph A. Popek
*Attorney, Agent, or Firm*—Stephen J. Limanek

[57] ABSTRACT

A system is provided in which two load devices connected to a latch are individually controlled and connected to a common input/output line. A bit/sense line is connected to each of two nodes on the latch. By providing two such latches each with bit/sense lines and two individually controlled load devices connected to the common input/output line, two cells of a word line may be sensed simultaneously.

19 Claims, 3 Drawing Figures

SIMPLE AMPLIFYING SYSTEM FOR A DENSE MEMORY ARRAY

TECHNICAL FIELD

This invention relates to integrated semiconductor memory circuits and more particularly to a sense amplifying system for memory circuits which have a very high density of cells, each including a very small capacitor for storing binary digits of information.

BACKGROUND ART

Integrated semiconductor memory circuits, particularly those employing cells which include a storage capacitor and a single switch, have achieved high memory cell densities. One of the simplest circuits for providing small memory cells is described in commonly assigned U.S. Pat. No. 3,387,286, filed July 14, 1967, by R. H. Dennard. Each of these cells employs essentially only a storage capacitor and a field effect transistor acting as a switch to selectively connect the capacitor to a bit/sense line. In also commonly assigned U.S. Pat. Nos. 3,811,076 by W. M. Smith and 3,841,926 by R. H. Garnache and W. M. Smith, both filed Jan. 2, 1973, there is disclosed a one-device field effect transistor memory cell of the type described in the above-identified Dennard patent which is made to a small size by utilizing a layer of doped polycrystalline silicon separated by a dielectric medium disposed on the surface of a semiconductor substrate for forming a storage capacitor.

A simple amplifier latch which may be used to sense signals stored in the one-device cells described in the hereinabove referenced patents is disclosed in U.S. Pat. No. 3,588,844, filed July 7, 1969.

The generation of a reference or dummy cell voltage for a one-device memory array having a value midway between the voltage values representing a stored binary digit "1" and a stored binary digit "0" by equalizing the "1" and "0" digit voltages prior to applying the equalized voltage to the dummy cell capacitor is taught in U.S. Pat. No. 3,940,747, filed Aug. 2, 1973.

In another commonly assigned U.S. Pat. No. 4,080,590, filed Mar. 31, 1976, by W. D. Pricer, there is disclosed a merged charge memory produced in a unipolar technology which is provided with very small capacitor cells, each of which includes substantially only a small storage capacitor having a bit/sense line connected to one terminal of the capacitor and a word line providing a coupling to the other terminal of the capacitor. In an embodiment of that invention, a direct current source of charges is produced at the surface of a semiconductor substrate and a plurality of inversion storage capacitors are formed also at the surface of the semiconductor substrate in a spaced-apart relationship from the charge source. Voltage pulses representing binary digits are applied to one terminal of the capacitors and the other terminal of the capacitors is coupled to the direct source of charges by the application of a word pulse to a word line.

In yet another commonly assigned U.S. Pat. No. 4,040,017, filed Mar. 31, 1976, by H. S. Lee, there is disclosed a capacitor memory similar to that disclosed in the above-identified U.S. Pat. No. 4,080,590 wherein the charges are produced from a charge source in the form of pulses injected into the storage capacitors rather than by utilizing a direct current source of charges.

In commonly assigned U.S. Pat. No. 4,160,275, filed on Apr. 3, 1978, by H. S. Lee, W. D. Pricer and N. G. Vogl, Jr., there is disclosed an accessing arrangement wherein the minimum pitch of a sense amplifier may be several times the dimension of the desired or optimum bit line pitch of a merged charge memory array by selecting at one time only a small number of cells, such as a byte, associated with a word line for writing or reading purposes.

To improve the cell density in a memory array, an interdigitated or interleaved bit/sense line arrangement is provided which eliminates sense amplifier pitch restrictions, as taught in IBM Technical Disclosure Bulletin, Vol. 16, No. 7, December 1973, page 241, by W. K. Hoffman.

In commonly assigned U.S. Pat. No. 4,287,576, filed Mar. 26, 1980, by W. D. Pricer, there is disclosed a sense amplifying system having an amplifying and latching device, an isolating device for the amplifying and latching device and a distinct pull up device. The sense amplifying system includes first and second access or bit lines, first and second differential amplifiers with isolation means for selectively coupling the amplifiers to the access lines and means for establishing a reference potential on the access lines. The first amplifier is used to sense the signals on the first bit line while using a reference voltage derived from the second bit line and the second amplifier arranged in tandem with the first amplifier is used to sense the signal on the second bit line while using a reference voltage derived from the first bit line. The first and second amplifiers are disposed preferably on one side of an array which includes the first and second bit lines, while third and fourth amplifiers, similar to the first and second amplifiers, are disposed on the opposite side of the array and are coupled to third and fourth bit lines which are also a part of the array.

High cell density and high performance in memory systems are generally conflicting goals because density implies weak signals and long high capacitance bit lines with an inability to strap the line segments with low impedance metal lines.

DISCLOSURE OF THE INVENTION

It is an object of this invention to provide an improved high performance amplifying system in a dense memory array.

It is another object of this invention to provide an improved high performance amplifying system in a dense memory array which utilizes simple amplifier circuits at low cost.

It is yet another object of this invention to provide an improved high performance amplifying system in a memory array having a high density of cells which is not limited by the size or pitch of the amplifying system.

It is still another object of this invention to provide an improved accessing system for a memory array of the one-device cells or of merged charge memory type cells having a very high density.

A further object of this invention is to provide an improved sense amplifying system for a two-dimensionally operated memory wherein each sense amplifier connected to a given bit line may have a pitch equal to the pitch of at least two bit lines of the memory.

It is yet another object of this invention to provide a memory system which uses small sense amplifiers and short bit/sense lines which do not require low impedance strapping for high performance.

In accordance with the teachings of this invention an improved system is provided in which two load devices connected to a latch are individually controlled and connected to a common input/output line. A bit/sense line is connected to each of two nodes on the latch. By providing two such latches each with bit/sense lines and two individually controlled load devices connected to the common input/output line, two cells of a word line may be sensed simultaneously.

The foregoing and other objects, features and advantages of the invention will be apparent from the following more particular description of the preferred embodiments of the invention, as illustrated in the accompanying drawings.

BEST MODE FOR CARRYING OUT THE INVENTION

Figure 1:
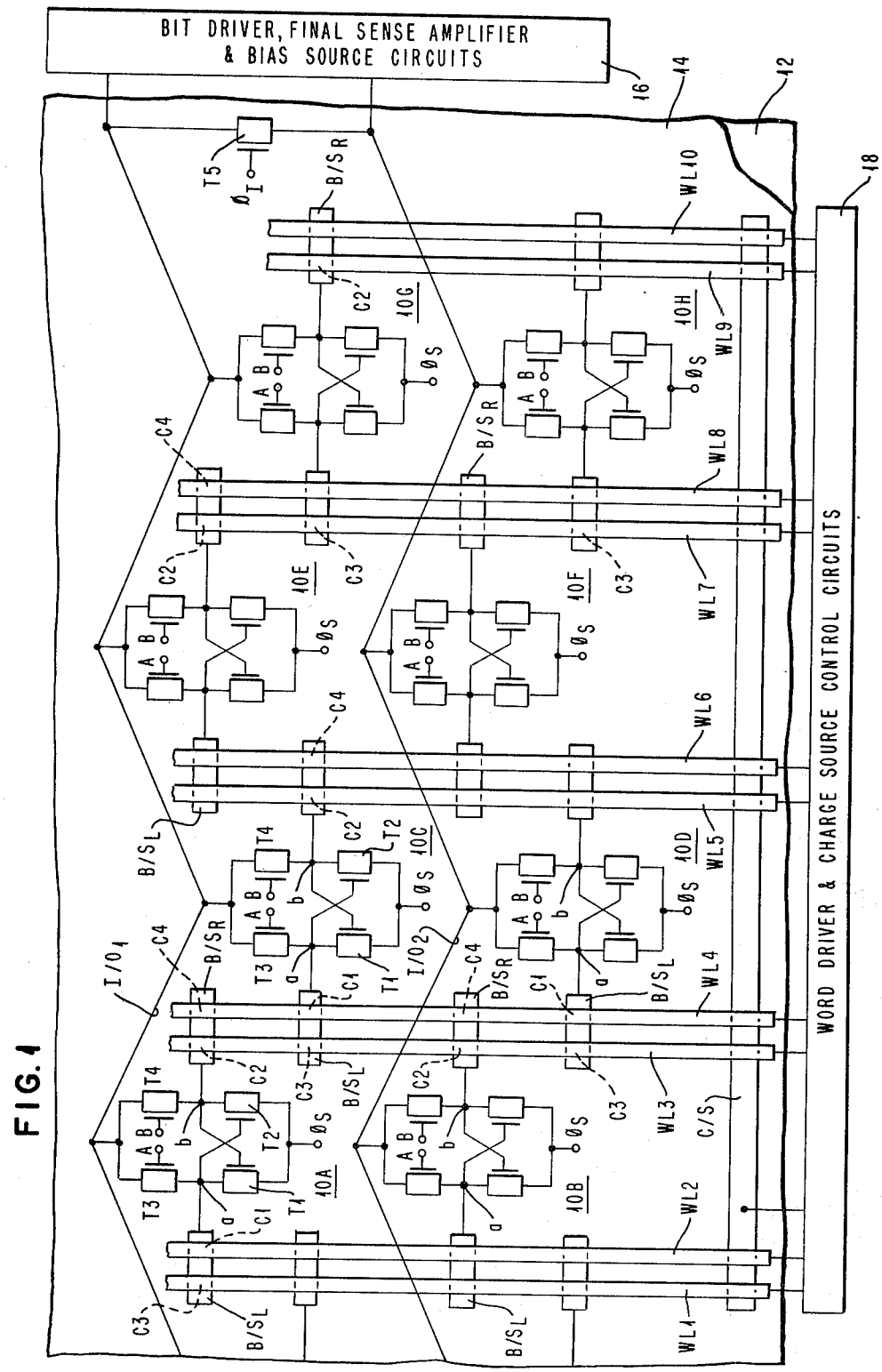
FIG. 1 is a circuit, having portions thereof indicated in plan view, of an embodiment of an amplifying system of the present invention.

Referring to FIG. 1 of the drawing in more detail, there is shown a memory system which includes a plurality of amplifying circuits 10A, 10B, 10C, 10D, 10E, 10F, 10G and 10H and an array of cells illustrated in plan view on a semiconductor substrate 12, preferably made of silicon, on which there is disposed an insulating layer 14, preferably made of silicon dioxide. Each of the amplifying circuits includes first and second latching transistors T1 and T2 connected at one end to a terminal to which a strobe pulse $\phi_S$ is applied. The other end of the first latching transistor T1 is connected to a first input/output line $I/O_1$ through a first load transistor T3 and the other end of the second latching transistor T2 is connected to the first input/output line $I/O_1$ through a second load transistor T4, with the control gate of load transistor T3 being identified by reference A and the control gate of the load transistor T4 being identified by the reference B. The first latching transistor T1 and the first load transistor T3 have a common point identified by node a and the second latching transistor T2 and the second load transistor T4 are connected to a common point identified as node b. Connected to node a of each of the amplifying circuits 10A–10H is a left bit/sense line $B/S_L$ and connected to node b is a right bit/sense line $B/S_R$.

The amplifying circuits 10A–10H are arranged in columns so that amplifying circuits 10A and 10B are aligned in the first column, amplifying circuits 10C and 10D are aligned in a second column, amplifying circuits 10E and 10F are in a third column and amplifying circuits 10G and 10H are in a fourth column. The amplifying circuits 10A–10H are also staggered so that the right bit/sense lines $B/S_R$ connected to node b of the amplifying circuits of one column and the left bit/sense lines $B/S_L$ connected to the nodes a of an adjacent column of amplifying circuits are arranged in an interdigitated fashion, i.e., a left bit/sense line $B/S_L$ is interposed between adjacent right bit/sense lines $B/S_R$. The array in addition to including the left and right bit/sense lines $B/S_L$ and $B/S_R$, also includes a plurality of word lines WL1, WL2, WL3, WL4, WL5, WL6, WL7, WL8, WL9 and WL10 arranged parallel to each other and orthogonal with respect to the left and right bit/sense lines $B/S_L$ and $B/S_R$.

The left and right bit/sense lines $B/S_L$ and $B/S_R$ are formed on the insulating layer 14 as are the word lines WL1–WL10, with the word lines WL1–WL10 crossing over the left and right bit/sense lines $B/S_L$ and $B/S_R$ and being appropriately insulated therefrom. Memory cells of the array are identified as cells C1, C2, C3 and C4. The location of cell C1 is identified by the intersection of the left bit/sense line $B/S_L$ and the second word line WL2 for C1 cells associated with the amplifying circuits 10A and 10B and cell C3 is located at the intersection between the left bit/sense line $B/S_L$ and the first word line WL1 for the amplifying circuits 10A and 10B. Cells C2 and C4 coupled to node b of the amplifying circuits 10A and 10B are defined by the intersection of the right bit/sense lines $B/S_R$ and third and fourth word lines WL3 and WL4, respectively, while the cells C1 and C3 coupled to node a of amplifying circuits 10C and 10D are located at the intersections of the left bit/sense lines $B/S_L$ and the third and fourth word lines WL3 and WL4, respectively. It can also be seen that cells C2 and C4 coupled to node b of the amplifying circuits 10C and 10D are located at the intersection of word lines WL5 and WL6 and the right bit/sense lines $B/S_R$. Word lines WL5, WL6, WL7 and WL8 intersecting with the left and right bit/sense lines connected to the nodes a and b of the amplifying circuits 10E and 10F locate the cells C1, C2, C3 and C4 associated with the amplifying circuits 10E and 10F. In a similar manner, word lines WL7, WL8, WL9 and WL10 intersecting with the left and right bit/sense lines $B/S_L$ and $B/S_R$ connected to the nodes a and b of the amplifying circuits 10G and 10H locate the cells C1, C2, C3 and C4 associated with the amplifying circuits 10G and 10H. The cells C1, C2, C3 and C4 each include a dielectric which is a thin portion of the insulating 14 disposed between the bit/sense lines $B/S_L$ and $B/S_R$ and the substrate 12. Likewise, the insulating layer 14 underneath the word lines WL1–WL10 is a thin segment to form a highly capacitive coupling between the word lines WL1–WL10 and the substrate 12. A charge source and sink, preferably and N+ diffusion region, C/S, is disposed under one end of each of the word lines WL1–WL10 and insulated therefrom.

The first input/output line $I/O_1$ is connected to the amplifying circuits 10A, 10C, 10E and 10G while a second input/output line $I/O_2$ is connected to amplifying circuits 10B, 10D, 10F and 10H. A shorting transistor T5 having a shorting phase pulse $\phi_I$ connected to its control gate selectively interconnects the first and second input/output lines $I/O_1$ and $I/O_2$. Also connected to the first and second input/output lines $I/O_1$ and $I/O_2$ are the bit driver, final sense amplifier and bias source circuits 16, which may be of any conventional type. Word driver and charge source control circuits 18, of any conventional type, are connected to the word lines WL1–WL10 and to the charge source and sink N+ diffusion region C/S.

Figure 2:
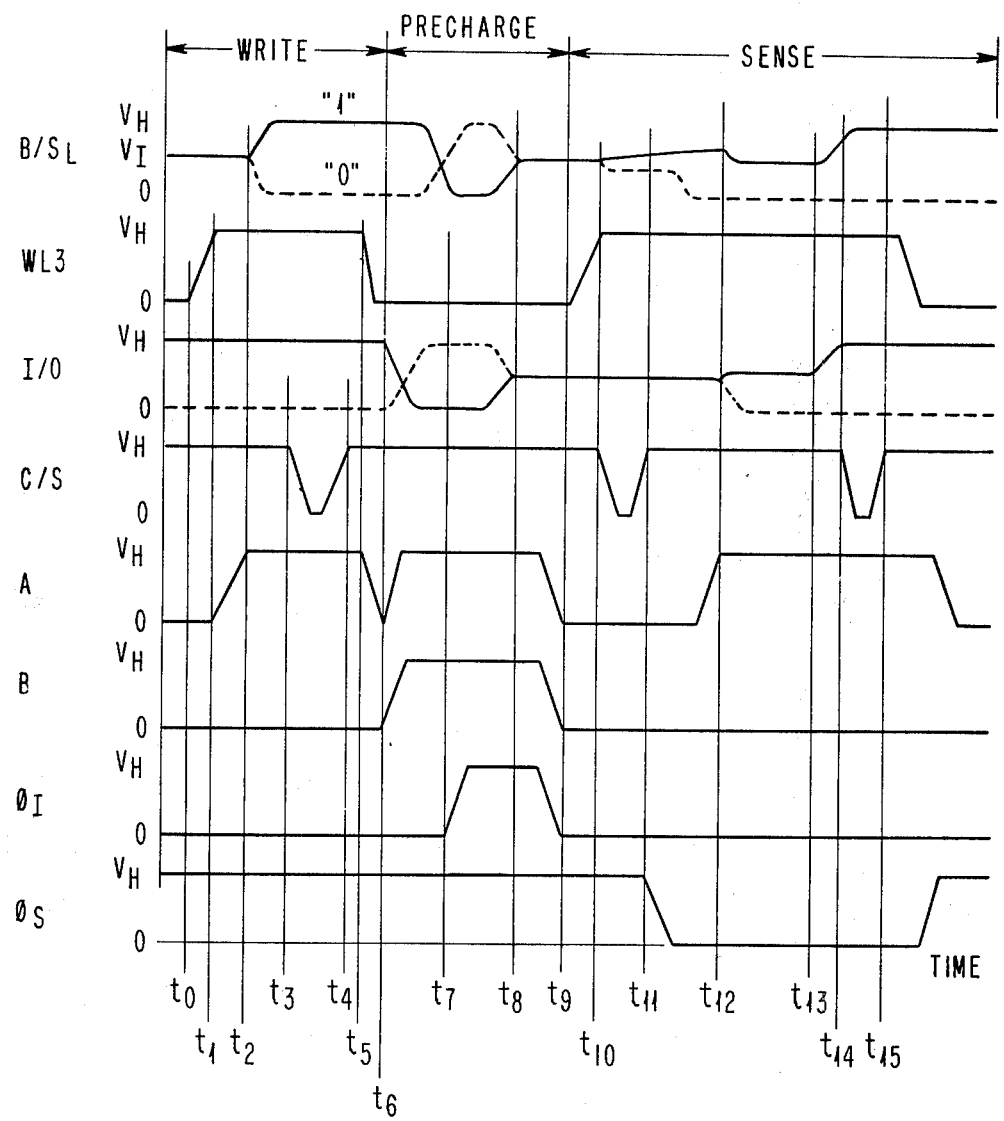
FIG. 2 is a first pulse program which may be used to operate the amplifying system of the invention illustrated in FIG. 1.

A first pulse program which may be used to operate the memory system of FIG. 1 is indicated in FIG. 2 of the drawings. With the use of this first pulse program, a voltage intermediate to the voltages used to store "1" and "0" binary digits of information in the cells C1, C2, C3 and C4 is applied to the bit/sense lines B/L$_L$ and B/S$_R$ at the initiation of the sense portion of an accessing cycle. Referring to FIGS. 1 and 2 of the drawings, to write binary information into cell C3 coupled to the amplifying circuit 10C, at time t$_0$ a word pulse is applied to the word line WL3 with the left bit/sense line B/S$_L$ connected to amplifying circuit 10C at an intermediate voltage level V$_I$, which may be equal to +2.5 volts or one half of V$_H$. At time t$_0$, the strobe pulse $\phi_S$ is at voltage V$_H$, as are the diffusion region C/S and the first input/output line I/O$_1$. Under these conditions, as is taught in the above-mentioned U.S. Pat. Nos. 4,080,590 and 4,040,017, any excess charge accummulated along the word line WL3 is drawin into the diffusion region C/S, which is acting as a charge sink. At time t$_1$, a pulse is applied to gate electrode A of the first load transistor T3 to turn on the transistor T3. If a "1" digit of binary information is to be stored in this cell C3, the first input/output line I/O$_1$ is maintained at V$_H$ and, therefore, the voltage on this left bit/sense line B/S$_L$ connected to amplifying circuit 10C is increased to V$_H$ through the first load transistor T3. At time t$_3$, the voltage on the N+ diffusion region C/S is lowered to ground potential, region C/S now acting as a charge source, with electrons traveling under the word line WL3 to the deep potential well produced under the word line WL3 in cell C3. Since the cell C3 coupled to circuit 10C is to store a "1" digit, the left bit/sense line B/S$_L$ being at a high potential V$_H$, a large amount of charge is supplied to the cell C3. At time t$_4$, the potential at region C/S is again increased to spill any excess charge in cells C2 and C3 and under the word line WL3 into the region C/S. At time t$_5$, the voltage on the word line WL3 is lowered to ground potential and charge is thus trapped in the deep potential formed at the cell C3. The first load transistor T3 is now turned off by lowering the voltage on control gate A to ground potential. At this time, a "1" digit of binary information is stored in the cell C3 coupled to the amplifying circuit 10C. If a "0" digit of binary information were to be stored in the cell C3 coupled to the amplifying circuit 10C, the input/output line I/O$_1$ would have been at ground potential as indicated in dashed lines in FIG. 2 between times t$_3$ and t$_5$, and, therefore, voltage on the left bit/sense line B/S$_L$ connected to the amplifying circuit 10C would have dropped to ground potential. Consequently, a shallow potential well, at best, would have been produced at cell C3 which would not have received many electrons between times t$_3$ and t$_5$.

Before sensing the information stored in a cell, the bit/sense lines B/S$_L$ and B/S$_R$ are charged to the intermediate voltage V$_I$. As indicated at time t$_6$, during the precharge portion of the accessing cycle indicated in FIG. 2 of the drawings, the first and second load transistors T3 and T4 are turned on by applying pulses to the control gates A and B of all amplifying circuits 10A-10H, while one half of all input/output lines I/O have applied thereto a ground potential, as indicated by the solid I/O line, with the other half of the input/output lines I/O, preferably alternate lines, having the voltage V$_H$ applied thereto, as indicated by dashed I/O lines, in FIG. 2. At time t$_7$, the shorting pulse $\phi_I$ is applied to the shorting transistors T5 interconnecting all the charged input/output lines I/O to the uncharge input/output lines I/O to produce at time t$_8$ the intermediate voltage V$_I$ on the input/output line I/O and on the bit/sense line B/S$_L$. Thereafter, the shorting phase pulse $\phi_I$ and the control pulses on control gates A and B of the first and second load transistors T3 and T4 are turned off, leaving all bit/sense lines B/S charged to the intermediate voltage V$_I$, as indicated in FIG. 2 at B/S$_L$.

To sense the signal stored in the cell C3 coupled to the amplifying circuit 10C, a word pulse is applied to the word line WL3 at time t$_9$ to couple the N+ diffusion region C/S to the selected cell C3. At time t$_{10}$, the voltage on the N+ diffusion region C/S is dropped to zero volts and charge from region C/S can now flow to or spill from the potential well of the selected cell C3. However, since the selected cell C3 is stored a "1" digit of binary information, the potential well of the selected cell C3 has stored therein a large amount of charge which causes the electrically floating left bit/sense line B/S$_L$ connected to the amplifying circuit 10C to slightly increase in voltage, as indicated by the solid line at B/S$_L$ of FIG. 2 during time t$_{10}$ to t$_{11}$. At time t$_{11}$, the voltage at the N+ diffusion region C/S returns to V$_H$ and the strobe pulse $\phi_S$ applied to the amplifying circuit 10C turns on the amplifying circuit 10C causing the voltage at node b to decrease while the voltage at node a remains constant. At time t$_{12}$, the first load transistor T3 is turned on by applying a voltage to control gate A, resulting in a slight discharge of the left bit/sense line B/S$_L$ to the first input/output line I/O$_1$. With the first input/output line I/O$_1$ continuing to float at about voltage V$_I$, a bootstrap circuit, which may be of any conventional type, in the bit driver, final sense amplifier and bias source circuits 16, raises the voltage on the first input/output line I/O$_1$ to V$_H$, and thus also the voltage on the left bit/sense line B/S$_1$ connected to the amplifying circuit 10C. This high voltage V$_H$ is detected by the final sense amplifier in circuits 16 and it regenerates the signal in the selected cell C3.

If a "0" digit of binary information had been stored in the selected cell C3, charge from the N+ diffusion region C/S would have filled the potential well of the selected cell C3 and, thus, the voltage V$_I$ on the left floating bit/sense line B/S$_L$ connected to the amplifying circuit 10C would have decreased between times t$_{10}$ and t$_{11}$, as indicated in FIG. 2, providing a lower voltage at node a than at node b of the amplifying circuit 10C. Accordingly, when the strobe pulse $\phi_S$ was being reduced to ground potention at time t$_{11}$ to provide amplification and latch up, the voltage on the left bit/sense line B/S$_L$ would have been reduced to zero volts, as indicated at B/S$_L$ of FIG. 2. Since at time t$_{13}$ the first input/output line I/O$_1$ is at ground, the bootstrap circuit in circuits 16 does not raise the voltage on the first input/output line I/O$_1$ to V$_H$.

During time t$_{14}$ to t$_{15}$ with the left bit/sense line B/S$_L$ either fully at voltage V$_H$ for restoring a "1" digit or at zero voltage for restoring a "0" digit in the selected cell C3, the voltage on the N+ diffusion region C/S is again lowered to zero volts to permit charge to flow to the potential well, if any, formed at the selected cell C3. Thereafter, the word line is turned off, followed by the first load transistor T3 being turned off and the strobe pulse $\phi_S$ being increased to a voltage V$_H$.

It should be noted that, if desired, two cells on a word line WL may be accessed simultaneously. For example, cell C2 coupled to the amplifying circuit 10A may be accessed simultaneously with the accessing of cell C3 coupled to the amplifying circuit 10C. However, after the signals are amplified by the amplifying circuits 10A and 10C, a control pulse is applied only to the control gate A of the amplifying circuit 10C to read out the information from cell C3 coupled to circuit 10C and after regeneration a control pulse is applied to the control gate B of the amplifying circuit 10A to read out the information from cell C2 coupled to circuit 10A. It can also be seen that cell C2 coupled to the amplifying circuit 10B and cell C3 coupled to the amplifying circuit 10D may also be accessed simultaneously by the second input/output line I/O$_2$ in a similar manner, so that all cells located on the word line WL3 are accessed simultaneously. Likewise, it should be understood that if word line WL7 is selected, all cells coupled to word line WL7 can be accessed simultaneously by using amplifying circuits 10E, 10F, 10G and 10H.

Figure 3:
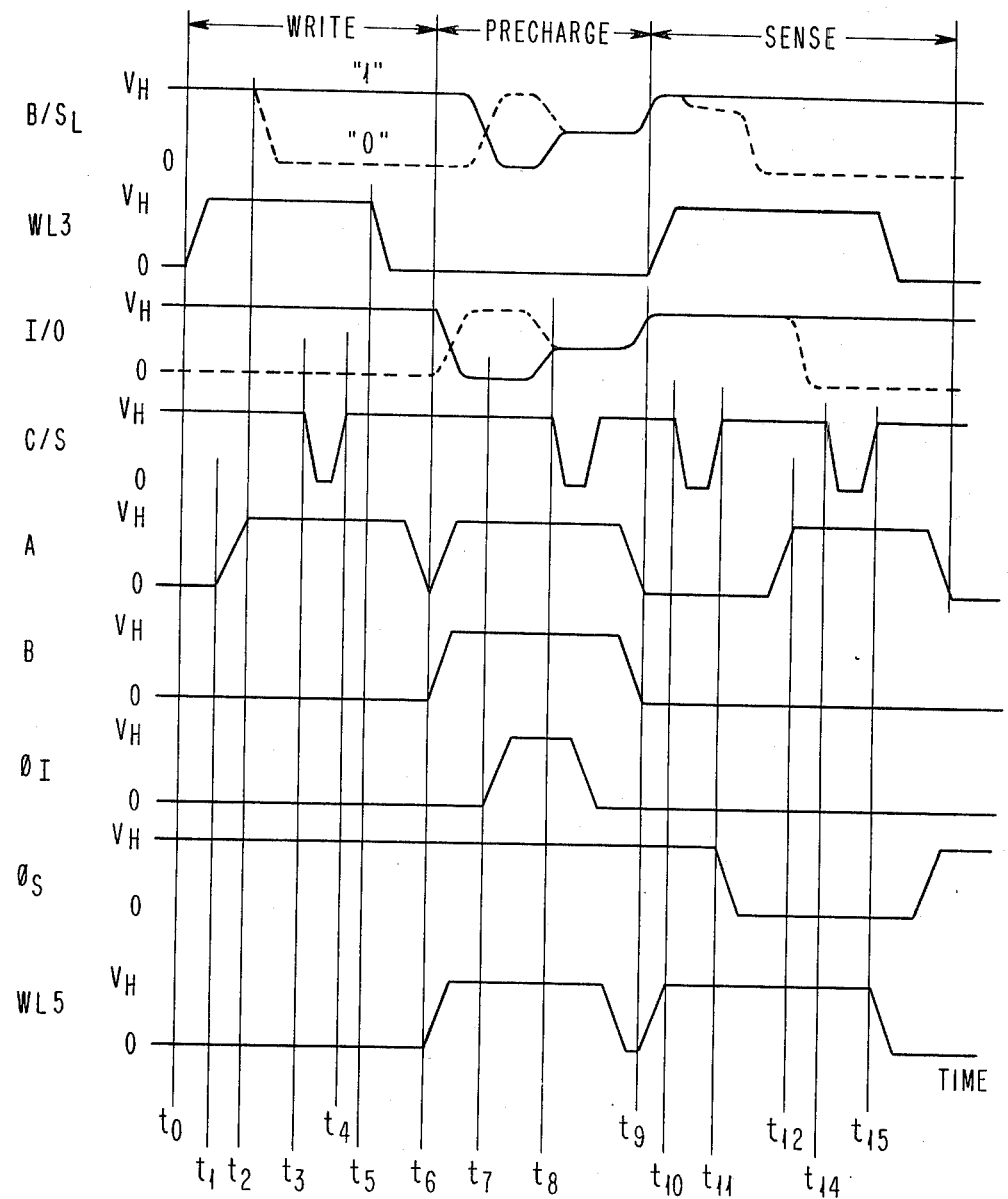
FIG. 3 is a second pulse program which may be used to operate the amplifying system of the invention illustrated in FIG. 1.

A second pulse program which may also be used to operate the memory system of FIG. 1 is indicated in FIG. 3 of the drawings. With the use of this second pulse program, the voltage V$_H$ is applied to the bit/sense lines B/S$_L$ and B/S$_R$ at the start of the sense portion of an accessing cycle. Furthermore, a dummy cell is provided in each left bit/sense line B/S$_L$ and in each right bit/sense line B/S$_R$, which is preferably the cell nearest to the amplifying circuits 10A-10H, i.e., cells C1 and C2. A dummy cell may be physically identical to the regular storage cells of the array.

To write binary information into the cell C3 coupled to the amplifying circuit 10C, the voltage on the word line WL3 begins to increase to V$_H$ at time t$_0$, as indicated in FIG. 3, with the left bit/sense line B/S$_L$ either at the voltage V$_H$ to write a "1" digit of binary information, as shown in solid line at B/S$_L$ in FIG. 3, or at ground potential to write a "0" digit, as shown in a dashed line at B/S$_L$ in FIG. 3, in much the same manner as described hereinabove in connection with the first pulse program of FIG. 2.

The selected cell C3 is also precharged in a manner similar to that described in connection with the first pulse program of FIG. 2 except that between times t$_8$ and t$_9$ the dummy cell, i.e., cell C2, coupled to node b of the amplifying circuit 10C has a half charge stored therein by turning on the word line WL$_5$ with the N+ diffusion region C/S at ground potential for supplying charge.

Sensing the signal stored in the selected cell C3 is similar to that described hereinabove in connection with the first pulse program of FIG. 2 except that the voltage on the floating left bit/sense line B/S$_L$ connected to the amplifying circuit 10C is initially at V$_H$ and both the selected cell word line and the corresponding dummy cell word line are turned on. If a "1" digit had been stored in the selected cell C3, the left bit/sense line B/S$_L$ remains high resulting in a voltage V$_H$ on node a and ground on node b of the amplifying circuit 10C. If a "0" digit had been stored in the selected cell C3, the left bit/sense line B/S$_L$ voltage would decrease, resulting in a zero potential on node a and V$_H$ on node b of the amplifying circuit 10C.

It should be noted that when using the second pulse program indicated in FIG. 3 of the drawings, the amplifying circuits in one column may regenerate half the cells of a word line, while the amplifying circuits in an adjacent column on the other side of the word line may be writing information into the remaining cells of the word line. For example, amplifying circuits 10C and 10D may be regenerating the information in the cells C3 of the word line WL3 coupled to the amplifying circuits 10C and 10D, while the amplifying circuits 10A and 10B are writing information into cells C2 coupled to the amplifying circuits 10A and 10B.

It can be seen that in accordance with the teachings of this invention, a simple four-transistor cross-coupled sense amplifying circuit has been provided having two load devices which are individually controlled and which are connected to a common input/output line. Furthermore, the sense amplifying circuits sensing information from cells of the same word line are arranged in an interdigitated fashion and one input/output line is shared by many amplifying circuits. Also, since the amplifying circuit is small, it may be readily used with short bit/sense lines which exhibit less capacitance delay and attenuation for improved performance.

In view of the interdigitated arrangement, an input/output line and its contacts do not have to be provided on the same pitch as that of the memory cells and, therefore, low resistance input/output lines are readily employed in the high density memory system which also provides improved performance.

While the invention has been particularly shown and described with reference to preferred embodiments thereof, it will be understood by those skilled in the art that various changes in form and details may be made therein without departing from the spirit and scope of the invention.

What is claimed is:

1. An amplifier comprising;
    first and second cross-coupled transistors having a common node,
    means for selectively applying a pulse to said node,
    a third transistor serially connected with said first transistor forming a first common point therebetween,
    a fourth transistor serially connected with said second transistor forming a second common point therebetween,
    means for simultaneously applying a first signal to said first common point and a reference voltage to said second common point during a first period of time and for simultaneously applying a second signal to said second common point and a reference voltage to said first common point during a second period of time,
    a common conductive line,
    means for applying a first control pulse to said third transistor for transferring said first signal on said first common point to said common line during said first period of time, and
    means for applying a second control pulse to said fourth transistor for transferring said second signal on said second common point to said common line during said second period of time.

2. An amplifier comprising
    a latch having a common point and first and second signal nodes,
    means for selectively applying a pulse to said common point,
    a first load device connected to said first signal node,
    a second load device connected to said second signal node,
    means for simultaneously applying a first signal to said first signal node and a reference voltage to said second signal node during a first period of time and for simultaneously applying a second signal to said second signal node and a reference voltage to said first signal node during a second period of time,
    a common conductive line,
    means for applying a first control voltage to said first load device for transferring said first signal on said first signal node to said common line during said first period of time, and means for applying a second control voltage to said second load device for transferring said second signal on said second signal node to said common line during said second period of time.

3. An amplifier as set forth in claim 2 wherein said latch includes first and second transistors, said first transistor being serially connected with said first load device between said common point and said common line, and said second transistor being serially connected with said second load device between said common point and said common line.

4. An amplifier as set forth in claim 3 wherein said first load device includes a third transistor having a control gate, said second load device includes a fourth transistor having a control gate and said first control voltage is applied to the control gate of said third transistor and said second control voltage is applied to the control gate of said fourth transistor.

5. An amplifier as set forth in claim 4 wherein said pulse applying means applies said pulse to said first common point during said first period of time after said first signal is applied to said first signal node and said reference voltage is applied to said second signal node and during said second period of time after said second signal is applied to said second signal node and said reference voltage is applied to said first signal node.

6. A memory system comprising an amplifying circuit including a latch having first and second signal nodes and first and second load devices, first and second bit/sense lines connected to said first and second signal nodes, respectively, an input/output line connected to said first signal node through said first load device and to said second signal node through said second load device, means for applying a first control voltage to said first load device for connecting said first signal node to said input/output line during a first period of time, and means for applying a second control voltage to said second load device for connecting said second signal node to said input/output line during a second period of time.

7. A memory system as set forth in claim 6 wherein said latch includes first and second cross-coupled field effect transistors and said first and second load devices include third and fourth field effect transistors, respectively.

8. A memory system as set forth in claim 7 wherein said first control voltage applying means applies said first control voltage to the control gate of said third transistor and said second control voltage applying means applies said second control voltage to the control gate of said fourth transistor.

9. A memory system as set forth in claim 8 wherein said latch further includes a common point and further including means for applying a control pulse to said common point.

10. A memory system comprising first and second amplifying circuits, each of said circuits including a latch having first and second nodes and first and second load devices, first and second bit/sense lines connected to the first and second nodes of said first amplifying circuit, respectively, third and fourth bit/sense lines connected to the first and second nodes of said second amplifying circuit, respectively, an input/output line connected to the first node of said first amplifying circuit through the first load device of said first amplifying circuit, to the second node of said first amplifying circuit through the second load device of said first amplifying circuit, to the first node of said second amplifying circuit through the first load device of said second amplifying circuit and to the second node of the second amplifying circuit through the second load device of said second amplifying circuit, means for applying a first control voltage to the first load device of said first amplifying circuit, means for applying a second control voltage to the second load device of said first amplifying circuit, means for applying a third control voltage to the first load device of said second amplifying circuit, and means for applying a fourth control voltage to the second load device of said second amplifying circuit.

11. A memory system as set forth in claim 10 wherein each of said latches includes first and second transistors and said first and second load devices include third and fourth transistors, respectively.

12. A memory system as set forth in claim 11 further including a word line coupled to said second and third bit/sense lines, said word line being interposed between said first and second amplifying devices.

13. A memory system comprising first, second, third and fourth amplifying circuits, each of said circuits including a latch having first and second nodes and first and second load devices, first and second bit/sense lines connected to the first and second nodes of said first amplifying circuit, respectively, third and fourth bits/sense lines connected to the first and second nodes of said second amplifying circuit, respectively, fifth and sixth bit/sense lines connected to the first and second nodes of said third amplifying circuit, respectively, seventh and eight bit/sense lines connected to the first and second nodes of said fourth amplifying circuit, respectively, a first input/output line connected to the first node of said first amplifying circuit through the first load device of said first amplifying circuit, to the second node of said first amplifying circuit through the second load device of said first amplifying circuit, to the first node of said second amplifying circuit through the first load device of the second amplifying circuit and to the second node of said second amplifying circuit through the second load device of the second amplifying circuit, a second input/output line connected to the first node of said third amplifying circuit through the first load device of said third amplifying circuit, to the second node of said third amplifying circuit through said second load device of said third amplifying circuit, to the first node of said fourth amplifying circuit through the first load device of the fourth amplifying circuit and to the second node of said fourth amplifying circuit through the second load device of the fourth amplifying circuit, means for applying control voltages to the first and second load devices of said first, second, third and fourth amplifying circuit, means for applying predetermined voltages to said first and second input/output lines, and means for selectively interconnecting said first and second input/output lines.

14. A memory system as set forth in claim 13 further including a word line coupled to one of said first and second bit/sense lines, to one of said third and fourth bit/sense lines, to one of said fifth and sixth bit/sense lines, and to one of said seventh and eighth bit/sense lines.

15. A memory system as set forth in claim 14 wherein said first and third amplifying circuits are arranged in a first column and said second and fourth amplifying circuits are arranged in a second column, and said word line is interposed between said first and second columns of amplifying circuits.

16. A memory system as set forth in claim 15 further including a source of charge coupled to said word line and word driver and charge source control means connected to said word line and to said source of charge.

17. A memory system as set forth in claim 16 wherein said latch circuit includes first and second transistors and said first and second load devices include third and fourth transistors, respectively, and said control voltage applying means applies a first voltage to the control gate of the third transistor of each amplifying circuit and a second voltage to the control gate of the fourth transistor of each amplifying circuit.

18. A memory system comprising an amplifying circuit including first and second cross-coupled transistors, means for selectively applying an operating pulse to said amplifying circuit to activate amplification, a third transistor serially connected with said first transistor forming a first common point therebetween, a fourth transistor serially connected with said second transistor forming a second common point therebetween, first and second bit/sense lines coupled to said first and second common points, respectively, an input/output line, means for applying a first control voltage to said third transistor for coupling said first common point to said input/output line through said third transistor during a first period of time, and means for applying a second control voltage to said fourth transistor for coupling said second common point to said input/output line through said fourth transistor during a second period of time.

19. A memory system comprising an amplifying circuit including first and second cross-coupled transistors, means for selectively applying an operating pulse to said amplifying circuit, a third transistor serially connected with said first transistor, a fourth transistor serially connected with said second transistor, first and second bit/sense lines connected to said first and second cross-coupled transistors, an input/output line, means for applying a first control voltage to said third transistor for coupling said first bit/sense line to said input/output line through said third transistor during a first period of time, and means for applying a second control voltage to said fourth transistor for coupling said second bit/sense line to said input/output line through said fourth transistor during a second period of time.

* * * * *